(12) United States Patent
Kobayashi et al.

(10) Patent No.: US 9,999,126 B2
(45) Date of Patent: Jun. 12, 2018

(54) RESIN COMPOSITION FOR PRINTED WIRING BOARD, PREPREG, METAL FOIL-CLAD LAMINATE, RESIN SHEET, AND PRINTED WIRING BOARD

(71) Applicant: MITSUBISHI GAS CHEMICAL COMPANY, INC., Tokyo (JP)

(72) Inventors: Takashi Kobayashi, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days. days.

(21) Appl. No.: 15/525,442

(22) PCT Filed: Jan. 29, 2016

(86) PCT No.: PCT/JP2016/052737
§ 371 (c)(1),
(2) Date: May 9, 2017

(87) PCT Pub. No.: WO2016/121957
PCT Pub. Date: Aug. 4, 2016

(65) Prior Publication Data
US 2017/0332487 A1 Nov. 16, 2017

(30) Foreign Application Priority Data

Jan. 30, 2015 (JP) .................. 2015-016460

(51) Int. Cl.
| | |
|---|---|
| *B32B 27/38* | (2006.01) |
| *B32B 15/08* | (2006.01) |
| *H05K 1/03* | (2006.01) |
| *B32B 15/092* | (2006.01) |
| *C08J 5/24* | (2006.01) |
| *C08G 8/28* | (2006.01) |
| *C08G 59/40* | (2006.01) |
| *C08K 3/36* | (2006.01) |

(52) U.S. Cl.
CPC ......... *H05K 1/0373* (2013.01); *B32B 15/092* (2013.01); *C08G 8/28* (2013.01); *C08G 59/4014* (2013.01); *C08J 5/24* (2013.01); *C08K 3/36* (2013.01); *C08J 2363/04* (2013.01)

(58) Field of Classification Search
None
See application file for complete search history.

(56) References Cited

U.S. PATENT DOCUMENTS

| | | | |
|---|---|---|---|
| 4,931,545 A | 6/1990 | Shimp et al. | |
| 4,988,780 A | 1/1991 | Das et al. | |
| 5,043,214 A | 8/1991 | Das et al. | |
| 2014/0329066 A1* | 11/2014 | Saito ............... | C08G 59/4007 |
| | | | 428/209 |
| 2016/0125972 A1 | 5/2016 | Arii et al. | |
| 2016/0125975 A1 | 5/2016 | Arii et al. | |

FOREIGN PATENT DOCUMENTS

| | | |
|---|---|---|
| JP | 3-503543 | 8/1991 |
| JP | 6-271669 | 9/1994 |
| JP | 11-124433 | 5/1999 |
| JP | 3081996 | 6/2000 |
| JP | 2000-191776 | 7/2000 |
| JP | 2000-319345 | 11/2000 |
| JP | 2001-64339 | 3/2001 |
| JP | 2008-195843 | 8/2008 |
| JP | 2010-174242 | 8/2010 |
| JP | 2015-209454 | 11/2015 |
| WO | 2013/084819 | 6/2013 |
| WO | 2014/203866 | 12/2014 |

OTHER PUBLICATIONS

International Search Report issued in WIPO Patent Application No. PCT/JP2016/052737, dated Apr. 5, 2016.
International Preliminary Examination Report in PCT/JP2016/052737 dated Aug. 1, 2017, with English translation thereof.

* cited by examiner

*Primary Examiner* — Coris Fung
(74) *Attorney, Agent, or Firm* — Greenblum & Bernstein, P.L.C.

(57) ABSTRACT

The present invention provides a resin composition for a printed wiring board comprising a cyanate compound (A) represented by following general formula (1):

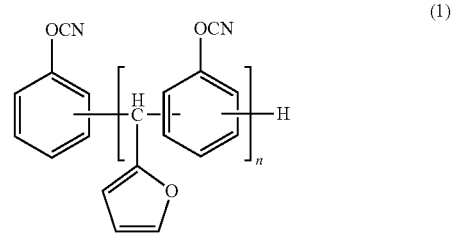

wherein n represents an integer of 1 or more; and an epoxy resin (B).

12 Claims, No Drawings

RESIN COMPOSITION FOR PRINTED WIRING BOARD, PREPREG, METAL FOIL-CLAD LAMINATE, RESIN SHEET, AND PRINTED WIRING BOARD

TECHNICAL FIELD

The present invention relates to a resin composition for a printed wiring board, a prepreg, a metal foil-clad laminate, a resin sheet, and a printed wiring board.

BACKGROUND ART

In recent years, higher integration and miniaturization of semiconductors widely used in electronic equipment, communication instruments, personal computers, and the like have accelerated increasingly. With this, various characteristics required of laminates for semiconductor packages used in printed wiring boards have become increasingly strict. Examples of the required characteristics include characteristics such as low water absorbency, moisture absorption heat resistance, flame retardancy, a low dielectric constant, a low dielectric loss tangent, a low thermal expansion coefficient, heat resistance, and chemical resistance. But, these required characteristics have not always been satisfied so far.

Conventionally, as resins for printed wiring boards having excellent heat resistance and electrical characteristics, cyanate compounds are known, and a resin composition containing a bisphenol A-based cyanate compound among them and another thermosetting resin and the like is widely used for printed wiring board materials and the like. The bisphenol A-based cyanate compound has characteristics excellent in electrical characteristics, mechanical characteristics, chemical resistance, and the like but may be insufficient in low water absorbency, moisture absorption heat resistance, flame retardancy, and heat resistance, and therefore for the purpose of further improving characteristics, various cyanate compounds having structures different from the bisphenol A-based cyanate compound are studied. As a resin having a structure different from the bisphenol A-based cyanate compound, for example, a novolac-based cyanate compound is often used (for example, see Patent Literature 1). In addition, prepolymerization of a novolac-based cyanate compound and a bisphenol A-based cyanate compound is also proposed (for example, see Patent Literature 2). Further, a halogen-based compound being contained in a resin composition by using a fluorinated cyanate compound or mixing or prepolymerizing a cyanate compound and a halogen-based compound is proposed (for example, see Patent Literatures 3 and 4).

CITATION LIST

Patent Literature

Patent Literature 1: Japanese Patent Laid-Open No. 11-124433
Patent Literature 2: Japanese Patent Laid-Open No. 2000-191776
Patent Literature 3: Japanese Patent No. 3081996
Patent Literature 4: Japanese Patent Laid-Open No. 6-271669

SUMMARY OF INVENTION

Technical Problem

However, when a cured product is fabricated using a resin composition containing a novolac-based cyanate compound, there are problems such as poor curability, a high water absorption rate of the obtained cured product, and a decrease in moisture absorption heat resistance of the cured product.

In addition, in a resin composition containing a prepolymer of a novolac-based cyanate compound and a bisphenol A-based cyanate compound, the curability is improved compared with the novolac-based cyanate compound by prepolymerization, but characteristics improvements in low water absorbency, moisture absorption heat resistance, and heat resistance are still insufficient. Thus, a further resin composition having improved low water absorbency, moisture absorption heat resistance, and heat resistance is required.

Further, in a resin composition in which a halogen-based compound is contained by using a fluorinated cyanate compound or mixing or prepolymerizing a cyanate compound and a halogen-based compound, the flame retardancy can be improved, but by using the halogen-based compound, a harmful substance such as dioxin may be generated during combustion. Thus, it is required to improve flame retardancy without comprising a halogen-based compound.

The present invention has been made in view of the above problems of the conventional art, and an object of the present invention is to provide a resin composition that can realize a printed wiring board having excellent moisture absorption heat resistance, heat resistance, and peel strength.

Solution to Problem

The present inventors have diligently studied the above problems and, as a result, found that an excellent printed wiring board having excellent moisture absorption heat resistance, heat resistance, and peel strength is realized by using a resin composition containing a cyanate compound (A) having a predetermined structure and an epoxy resin (B), arriving at the present invention. Specifically, the present invention is as follows.

[1]
A resin composition for a printed wiring board comprising a cyanate compound (A) represented by following general formula (1):

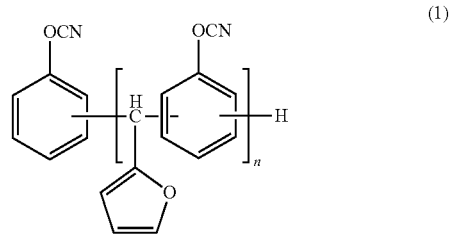

(1)

wherein n represents an integer of 1 or more; and
an epoxy resin (B).

[2]
The resin composition for the printed wiring board according to [1], wherein the cyanate compound (A) represented by the general formula (1) is obtained by cyanation of a furan ring-containing phenol novolac resin.

[3]
The resin composition for the printed wiring board according to [1] or [2], comprising 1 to 90% by mass of the cyanate compound (A) represented by the general formula (1) based on a total amount (100% by mass) of resin solids in the resin composition for the printed wiring board.

[4]
The resin composition for the printed wiring board according to any of [1] to [3], further comprising a filler (C).

[5]
The resin composition for the printed wiring board according to any of [1] to [4], further comprising one or two or more selected from the group consisting of a maleimide compound, a phenolic resin, and a cyanate compound other than the cyanate compound (A) represented by the general formula (1).

[6]
The resin composition for the printed wiring board according to any of [1] to [5], wherein the epoxy resin (B) is one or two or more selected from the group consisting of a biphenyl aralkyl-based epoxy resin, a naphthylene ether-based epoxy resin, a polyfunctional phenol-based epoxy resin, and a naphthalene-based epoxy resin.

[7]
The resin composition for the printed wiring board according to any of [4] to [6], comprising 50 to 1600 parts by mass of the filler (C) based on the total amount (100 parts by mass) of the resin solids in the resin composition for the printed wiring board.

[8]
A prepreg comprising a base material; and the resin composition for the printed wiring board according to any of [1] to [7] with which the base material is impregnated or coated.

[9]
A metal foil-clad laminate comprising one of the prepreg according to [8] or two or more of the prepregs according to [8] laminated; and metal foil laminate-molded on one surface or both surfaces of the prepreg.

[10]
A resin sheet comprising a sheet base material; and the resin composition for the printed wiring board according to any of [1] to [7] applied and dried on one surface or both surfaces of the sheet base material.

[11]
A printed wiring board comprising an insulating layer comprising the resin composition for the printed wiring board according to any of [1] to [7]; and a conductor layer formed on one surface or both surfaces of the insulating layer.

Advantageous Effects of Invention

According to the resin composition for a printed wiring board according to the present invention, a high performance printed wiring board having excellent moisture absorption heat resistance, heat resistance, and peel strength can be realized.

DESCRIPTION OF EMBODIMENTS

A mode for carrying out the present invention (hereinafter simply referred to as "this embodiment") will be described in detail below. This embodiment below is an illustration for describing the present invention and is not intended to limit the present invention to the embodiment below. Appropriate modifications can be made to the present invention without departing from the spirit thereof.

<Resin Composition for Printed Wiring Board>

A resin composition for a printed wiring board in this embodiment comprises a cyanate compound (A) having a structure represented by the following general formula (1):

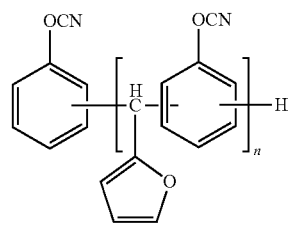

wherein n represents an integer of 1 or more, preferably represents an integer of 1 or more and 100 or less, more preferably represents an integer of 1 or more and 50 or less, and further preferably represents an integer of 1 or more and 20 or less; and
an epoxy resin (B).

A cured product obtained from a resin composition using the cyanate compound (A) having the structure represented by general formula (1) has good moisture absorption heat resistance and further improved heat resistance. The factor contributing to this is presumed as follows (however, the factor is not limited to this). The cyanate compound (A) in this embodiment has a furan ring in its side chain, and thus has excellent compatibility with the epoxy resin (B) by interaction with the epoxy groups of the epoxy resin (B). Thus, it is presumed that for the cyanate compound (A) and the epoxy resin (B) in the resin composition in this embodiment, the reaction proceeds uniformly also when a cured product is formed. As a result, the resin composition in this embodiment has excellent moisture absorption heat resistance and heat resistance when formed into a cured product.

The cyanate compound (A) in this embodiment (hereinafter sometimes simply referred to as a "cyanate compound") is not particularly limited as long as it is a compound represented by the above formula (1). The method for obtaining the cyanate compound (A) represented by general formula (1) is not particularly limited. Examples thereof include a method of cyanation of the hydroxy groups of a furan ring-containing phenol novolac resin represented by the following general formula (2):

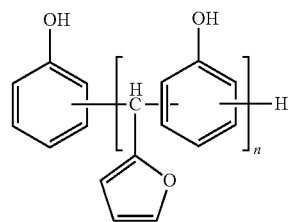

wherein n represents an integer of 1 or more.

The method of cyanation of the hydroxy groups of the furan ring-containing phenol novolac resin represented by the above general formula (2) is not particularly limited, and known methods can be applied. Examples of such a production method include a method involving obtaining or synthesizing a hydroxyl group-containing compound having the desired skeleton, and modifying the hydroxyl groups of the hydroxyl group-containing compound by a known method for cyanation. Examples of the method of cyanation of hydroxyl groups include a method described in Ian Hamerton, "Chemistry and Technology of Cyanate Ester Resins," Blackie Academic & Professional.

The cyanate compound (A) obtained by the method involving cyanation of the hydroxy groups of the furan ring-containing phenol novolac resin represented by general formula (2) preferably shows absorption corresponding to cyanate groups and shows no absorption corresponding to hydroxy groups when measured by an infrared absorption spectrum (IR spectrum). By using the cyanate compound (A) showing no absorption corresponding to hydroxy groups, the compatibility between the cyanate compound (A) and the epoxy resin (B) is made excellent due to the fact that the content of the furan ring-containing phenol novolac resin as an impurity is equal to or less than a predetermined content. As a result, the moisture absorption heat resistance tends to be excellent.

The content of the cyanate compound (A) represented by formula (1) in the resin composition in this embodiment can be appropriately set according to the desired characteristics and is not particularly limited. However, the resin composition preferably contains 1 to 90% by mass, more preferably 45 to 85% by mass, and further preferably 47% by mass or more and 60% by mass or less of the cyanate compound (A) based on the total amount (100% by mass) of resin solids in the resin composition. When the content of the cyanate compound (A) is 1% by mass or more, the operation and effect of the present invention tend to be more reliably obtained. In addition, when the content of the cyanate compound (A) is 45% by mass or more and 85% by mass or less, both moisture absorption heat resistance and peel strength tend to be able to be achieved. It is presumed that the fact that both moisture absorption heat resistance and peel strength can be achieved is due to the fact that a cured product having a composition excellent in the balance of the amount ratio between the cyanate compound (A) and the epoxy resin (B) and uniform is obtained (however, the factor is not limited to this).

The dissolution rate of the cyanate compound (A) in methyl ethyl ketone is preferably 10% by mass or more and 90% by mass or less, more preferably 20% by mass or more and 90% by mass or less, and further preferably 30% by mass or more and 90% by mass or less when 100 parts by mass (100% by mass) of the cyanate compound (A) is dissolved in 100 parts by mass of methyl ethyl ketone at 25° C. By using the cyanate compound (A) having a dissolution rate in such a range, the moisture absorption heat resistance and the heat resistance tend to be better. Here, "dissolution" means a state in which another substance dissolves in a methyl ethyl ketone liquid to form a uniform phase.

The electrical conductivity of water recovered after the cyanate compound (A) is water-washed is preferably 100 µS/cm or less, more preferably 50 µS/cm, and further preferably 30 µS/cm. The cyanate compound (A) having an electrical conductivity in such a range means that the amount of ionic compounds contained as impurities is equal to or less than a predetermined amount, and tends to have better moisture absorption heat resistance and heat resistance. The electrical conductivity is measured by the method of JIS K 0130.

The weight average molecular weight (Mw) of the cyanate compound (A) is preferably 5000 or less, more preferably 3000 or less, and further preferably 1000 or less. The cyanate compound (A) having a weight average molecular weight (Mw) in such a range tends to have better moisture absorption heat resistance and heat resistance. The weight average molecular weight is measured by gel permeation chromatography (GPC) that is a known method.

In this embodiment, "the total amount of resin solids in the resin composition" refers to the total amount of resin components in the resin composition excluding a solvent and a filler (C) described later, unless otherwise noted. In addition, the resin components include at least the cyanate compound (A) and the epoxy resin (B) in the resin composition and also include other resin components.

The epoxy resin (B) in this embodiment (hereinafter sometimes simply referred to as an "epoxy resin") is not particularly limited as long as it is a resin having two or more epoxy groups in one molecule. For example, known epoxy resins can be appropriately used, and the type of the epoxy resin (B) is also not particularly limited. Specific examples of the epoxy resin (B) are not particularly limited and include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, triglycidyl isocyanurate, aralkyl novolac-based epoxy resins, biphenyl aralkyl-based epoxy resins, naphthylene ether-based epoxy resins, cresol novolac-based epoxy resins, xylene novolac-based epoxy resins, dicyclopentadiene novolac-based epoxy resins, biphenyl novolac-based epoxy resins, phenol aralkyl novolac-based epoxy resins, naphthol aralkyl novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins; glycidyl amines, glycidyl esters, compounds obtained by epoxidizing double bonds of butadiene and the like, and compounds obtained by reaction of hydroxyl group-containing silicone resins and epichlorohydrin. Among these epoxy resins (B), biphenyl aralkyl-based epoxy resins, naphthylene ether-based epoxy resins, polyfunctional phenol-based epoxy resins, and naphthalene-based epoxy resins are preferred in terms of flame retardancy and heat resistance. One of these epoxy resins (B) can be used alone, or two or more of these epoxy resins (B) can be used in appropriate combination.

The content of the epoxy resin (B) in this embodiment can be appropriately set according to the desired characteristics and is not particularly limited. However, the resin composition preferably contains 10 to 99% by mass, more preferably 15 to 55% by mass, and further preferably 40 to 53% by mass of the epoxy resin (B) based on the total amount (100% by mass) of the resin solids in the resin composition. When the content of the epoxy resin (B) is 10 to 99% by mass, the operation and effect of the present invention tend to be more reliably obtained. In addition, when the content of the epoxy resin (B) is 15 to 55% by mass, both moisture absorption heat resistance and peel strength tend to be able to be achieved.

The resin composition in this embodiment preferably further contains the filler (C) (hereinafter also referred to as a "component (C)" or "(C)"). As the filler (C), known fillers can be appropriately used without being particularly limited, and the type of the filler (C) is also not particularly limited. Those generally used in the laminate applications of the resin composition can be preferably used. Specific examples of the filler (C) include inorganic fillers such as silicas such as natural silica, fused silica, synthetic silica, amorphous silica, AEROSIL, and hollow silica; white carbon, titanium white, zinc oxide, magnesium oxide, zirconium oxide, nitrides such as boron nitride, aggregated boron nitride, silicon nitride, and carbon nitride, carbides such as silicon carbide, titanates such as strontium titanate and barium titanate, aluminum nitride, sulfates or sulfites such as barium sulfate, calcium sulfate, and calcium sulfite, metal hydroxides such as aluminum hydroxide, heat-treated products of aluminum hydroxide (products obtained by heat-treating aluminum hydroxide to decrease some of the water of crystallization), magnesium hydroxide, and calcium hydroxide, molybdenum compounds such as molybdenum oxide and zinc molybdate, carbonates such as calcium carbonate, magnesium carbonate, and hydrotalcite, borates such as zinc borate, barium metaborate, aluminum borate, calcium borate, and sodium borate, zinc stannate, alumina, gibbsite, boehmite, clay, kaolin, talc, calcined clay, calcined kaolin, calcined talc, mica, E-glass, A-glass, NE-glass, C-glass, L-glass, D-glass, S-glass, M-glass G20, glass short fibers (including fine powders of glass such as E glass, T glass, D glass, S glass, and Q glass), hollow glass, and spherical glass; and organic fillers such as rubber powders such as styrene-based rubber powders, butadiene-based rubber powders, and acrylic rubber powders, core-shell-based rubber powders, silicone resin powders, silicone rubber powders, and silicone composite powders. One of these fillers (C) can be used alone, or two or more of these fillers (C) can be used in appropriate combination.

The content of the filler (C) in this embodiment can be appropriately set according to the desired characteristics and is not particularly limited. However, the resin composition preferably contains 50 to 1600 parts by mass of the filler (C) based on the total amount (100 parts by mass) of the resin solids in the resin composition. By setting the content of the filler (C) at 50 to 1600 parts by mass, the moldability of the resin composition tends to be good.

Here, when the inorganic filler (C) is used, a silane coupling agent and a wetting and dispersing agent are preferably used in combination. The silane coupling agent is not particularly limited. Those generally used for surface treatment of inorganic matter can be preferably used, and the type of the silane coupling agent is also not particularly limited. Specific examples of the silane coupling agent include aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane and β-(3,4-epoxycyclohexyl)ethyltrimethoxysilane, vinylsilane-based silane coupling agents such as γ-methacryloxypropyltrimethoxysilane and vinyl-tri(β-methoxyethoxy)silane; cationic silane-based silane coupling agents such as N-β-(N-vinylbenzylaminoethyl)-γ-aminopropyltrimethoxysilane hydrochloride; and phenylsilane-based silane coupling agents. One silane coupling agent can be used alone, or two or more silane coupling agents can be used in appropriate combination. In addition, the wetting and dispersing agent is not particularly limited. Those generally used for paints can be preferably used, and the type of the wetting and dispersing agent is also not particularly limited. For the wetting and dispersing agent, preferably copolymer-based wetting and dispersing agents are used. Specific examples of the copolymer-based wetting and dispersing agents are not particularly limited and include Disperbyk-110, 111, 161, and 180, BYK-W996, BYK-W9010, BYK-W903, and BYK-W940 manufactured by BYK Japan KK. One wetting and dispersing agent can be used alone, or two or more wetting and dispersing agents can be used in appropriate combination.

In addition, the resin composition in this embodiment may further contain a curing accelerator for appropriately adjusting the curing rate, as needed, though not particularly limited. This curing accelerator is not particularly limited. Those generally used as curing accelerators for cyanate compounds, epoxy resins, and the like can be preferably used, and the type of the curing accelerator is also not particularly limited. Specific examples of the curing accelerator include organometallic salts such as zinc octylate, zinc naphthenate, cobalt naphthenate, copper naphthenate, acetylacetone iron, nickel octylate, and manganese octylate; phenol compounds such as phenol, xylenol, cresol, resorcin, catechol, octyl phenol, and nonyl phenol; alcohols such as 1-butanol and 2-ethylhexanol; imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole and derivatives such as adducts of carboxylic acids of these imidazoles and acid anhydrides thereof; amines such as dicyandiamide, benzyldimethylamine, and 4-methyl-N,N-dimethylbenzylamine; phosphorus compounds such as phosphine-based compounds, phosphine oxide-based compounds, phosphonium salt-based compounds, and diphosphine-based compounds; epoxy-imidazole adduct-based compounds, peroxides such as benzoyl peroxide, p-chlorobenzoyl peroxide, di-t-butyl peroxide, diisopropyl peroxycarbonate, and di-2-ethylhexyl peroxycarbonate; and azo compounds such as azobisisobutyronitrile. One curing accelerator can be used alone, or two or more curing accelerators can be used in appropriate combination.

The content of the curing accelerator can be appropriately adjusted considering the degrees of cure of the resins, the viscosity of the resin composition, and the like and is not particularly limited. However, preferably, the resin composition contains 0.005 to 10 parts by mass of the curing accelerator based on the total amount (100 parts by mass) of the resin solids in the resin composition.

One or two or more selected from the group consisting of a maleimide compound, a phenolic resin, and a cyanate compound other than the cyanate compound (A) represented by general formula (1) described above (hereinafter referred to as "another cyanate compound") may be further contained in the resin composition in this embodiment in a range in which the operation and effect according to the present invention are not impaired.

The another cyanate compound is not particularly limited as long as it is a resin having in the molecule an aromatic moiety substituted by at least one cyanato group. Specific examples of the another cyanate compound include a cyanate compound represented by the following general formula (3):

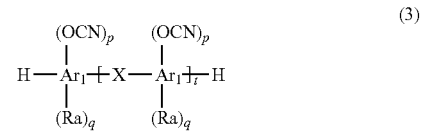

(3)

wherein $Ar_1$ represents a phenylene group, a naphthylene group, or a biphenylene group that may have a substituent, and $Ar_1$ is each independently as defined above when a plurality of $Ar_1$ are present. Ra represents a hydrogen atom, an alkyl group having 1 to 6 carbon atoms, an aryl group having 6 to 12 carbon atoms, an alkoxy group having 1 to 4 carbon atoms, or a group in which an alkyl group having 1 to 6 carbon atoms and an aryl group having 6 to 12 carbon atoms are mixed, and Ra is each independently as defined above when a plurality of Ra are present. Any position can be selected for the substituent(s) on the aromatic ring represented by $Ar_1$ or Ra. p represents the number of bonded cyanato groups, and the number of bonded cyanato groups is an integer of 1 to 3, and the numbers of bonded cyanato groups are each independently as defined above when a plurality of the numbers of bonded cyanato groups are present. q represents the number of bonded Ra, and the number of bonded Ra is 4-p when $Ar_1$ is a phenylene group, 6-p when $Ar_1$ is a naphthylene group, and 8-p when $Ar_1$ is a biphenylene group, and the numbers of bonded Ra are each independently as defined above when a plurality of the numbers of bonded Ra are present. t represents an integer of 0 to 50, and the compound represented by general formula (3) may be a mixture of compounds having different t. X represents any of a single bond, a divalent organic group having 1 to 20 carbon atoms (a hydrogen atom may be replaced by a heteroatom), a divalent organic group having 1 to 10 nitrogen atoms (for example, —N—R—N— (R represents an alkylene group that may have a substituent)), a carbonyl group (—CO—), a carboxy group (—C(=O)O—), a carbonyl dioxide group (—OC(=O)O—), a sulfonyl group (—SO$_2$—), and a divalent sulfur atom and a divalent oxygen atom, and X is each independently as defined above when a plurality of X are present.

In general formula (3), the alkyl group represented by Ra may have any of a linear chain structure and a branched chain structure and a cyclic structure (cycloalkyl group or the like). In addition, in general formula (3), hydrogen atoms in the alkyl group and the aryl group represented by Ra may each be independently replaced by a halogen atom such as fluorine or chlorine; an alkoxy group such as a methoxy group or a phenoxy group; a cyano group; or the like.

The above alkyl group is not particularly limited. Examples thereof include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the above aryl group are not particularly limited and include a phenyl group, a xylyl group, a mesityl group, a naphthyl group, a phenoxyphenyl group, an ethylphenyl group, o-, m-, and p-fluorophenyl groups, a dichlorophenyl group, a dicyanophenyl group, a trifluorophenyl group, a methoxyphenyl group, and o-, m-, and p-tolyl groups.

The above alkoxy group is not particularly limited. Examples thereof include a methoxy group, an ethoxy group, a propoxy group, an isopropoxy group, a n-butoxy group, an isobutoxy group, a tert-butoxy group, and a phenoxy group.

The divalent organic group having 1 to 50 carbon atoms represented by X in general formula (3) is not particularly limited. Examples thereof include alkylene groups such as a methylene group, an ethylene group, a trimethylene group, and a propylene group, cycloalkylene groups such as a cyclopentylene group, a cyclohexylene group, and a trimethylcyclohexylene group, and divalent organic groups having an aromatic ring such as a biphenylylmethylene group, a dimethylmethylene-phenylene-dimethylmethylene group, a fluorenediyl group, and a phthalidediyl group. A hydrogen atom in the above divalent organic group may be replaced by a halogen atom such as fluorine or chlorine; an alkoxy group such as a methoxy group or a phenoxy group; a cyano group; or the like.

The divalent organic group having 1 to 10 nitrogen atoms represented by X in general formula (3) is not particularly limited. Examples thereof include an imino group and a polyimide group.

In addition, the structure represented by X in general formula (3) is not particularly limited. Examples thereof also include a structure represented by the following general formula (4) and a structure represented by the following general formula (5).

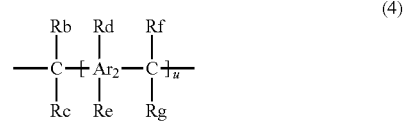

(4)

wherein $Ar_2$ represents a phenylene group, a naphthylene group, or a biphenylene group, and $Ar_2$ is each independently as defined above when a plurality of $Ar_2$ are present. Rb, Rc, Rf, and Rg each independently represent a hydrogen atom, an alkyl group having 1 to 6 carbon atoms, an aryl group having 6 to 12 carbon atoms, a trifluoromethyl group, or an aryl group substituted by at least one phenolic hydroxy group. In addition, Rb, Rc, Rf, and Rg when a plurality of Rb, Rc, Rf, and Rg are present are each independent. Rd and Re each independently represent a hydrogen atom, an alkyl group having 1 to 6 carbon atoms, an aryl group having 6 to 12 carbon atoms, an alkoxy group having 1 to 4 carbon atoms, or a hydroxy group. u represents an integer of 0 to 5, and the compound represented by general formula (3) may be a compound having the same u or a mixture of compounds having different u.

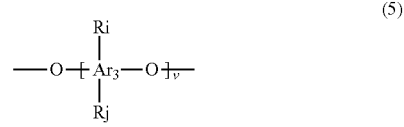

(5)

wherein $Ar_3$ represents any one of a phenylene group, a naphthylene group, and a biphenylene group, and $Ar_3$ is each independently as defined above when a plurality of $Ar_3$ are present. Ri and Rj each independently represent any of a hydrogen atom, an alkyl group having 1 to 6 carbon atoms, an aryl group having 6 to 12 carbon atoms, a benzyl group, an alkoxy group having 1 to 4 carbon atoms, a hydroxy group, a trifluoromethyl group, and an aryl group substituted by at least one cyanato group. v represents an integer of 0 to 5, and the compound represented by general formula (3) may be a mixture of compounds having different v.

Further, examples of the structure represented by X in general formula (3) also include a divalent group represented by any of the following formulas:

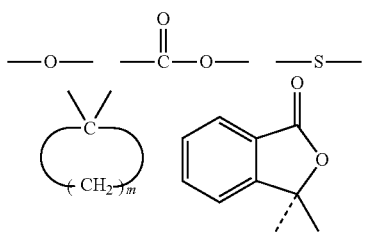

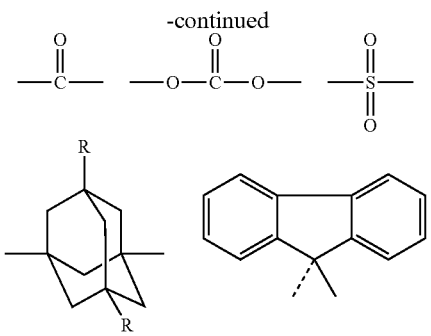

wherein m represents an integer of 4 to 7. A plurality of R each independently represent a hydrogen atom or an alkyl group having 1 to 6 carbon atoms.

$Ar_2$ in general formula (4) and $Ar_3$ in general formula (5) are not particularly limited. Examples thereof include a 1,4-phenylene group, a 1,3-phenylene group, a 4,4-biphenylene group, a 2,4-biphenylene group, a 2,2-biphenylene group, a 2,3-biphenylene group, a 3,3-biphenylene group, a 3,4-biphenylene group, a 2,6-naphthylene group, a 1,5-naphthylene group, a 1,6-naphthylene group, a 1,8-naphthylene group, a 1,3-naphthylene group, a 1,4-naphthylene group, and a 2,7-naphthylene group.

The alkyl group and the aryl group represented by Rb to Rf in general formula (4) are each independently similar to the one described in general formula (3).

Specific examples of the cyanate compound represented by general formula (3) are not particularly limited and include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanatophenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-trimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2-dicyanato-1,1-binaphthyl, 1,3-, 1,4-, 1,5-, 1,6-, 1,7-, 2,3-, 2,6-, or 2,7-dicyanatonaphthalene, 2,2- or 4,4-dicyanatobiphenyl, 4,4-dicyanatooctafluorobiphenyl, 2,4- or 4,4-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis (4-cyanatophenyl) ether, bis(4-cyanatophenyl) sulfide, bis (4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4-oxydiphthalimide, bis(N-3-cyanato-4-methylphenyl)-4,4-oxydiphthalimide, bis(N-4-cyanatophenyl)-4,4-oxydiphthalimide, bis(N-4-cyanato-2-methylphenyl)-4,4-(hexafluoroisopropylidene)diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indolin-2-one, 2-phenyl-3,3-bis(4-cyanatophenyl)indolin-2-one, and products obtained by cyanation of phenolic resins such as phenol novolac resins and cresol novolac resins (those obtained by reacting a phenol, an alkyl-substituted phenol, or a halogen-substituted phenol and a formaldehyde compound such as formalin or paraformaldehyde in an acidic solution by a known method), trisphenol novolac resins (those obtained by reacting hydroxybenzaldehyde and a phenol in the presence of an acidic catalyst), fluorene novolac resins (those obtained by reacting a fluorenone compound and a 9,9-bis(hydroxyaryl)fluorene in the presence of an acidic catalyst), phenol aralkyl resins, cresol aralkyl resins, naphthol aralkyl resins, and biphenyl aralkyl resins (those obtained by reacting a bishalogenomethyl compound as represented by $Ar_3$—$(CH_2Y)_2$ and a phenol compound with an acidic catalyst or without a catalyst by a known method, and those obtained by reacting a bis (alkoxymethyl) compound as represented by $Ar_3$—$(CH_2OR)_2$ or a bis(hydroxymethyl) compound as represented by $Ar_3$—$(CH_2OH)_2$ and a phenol compound in the presence of an acidic catalyst by a known method, or those obtained by polycondensing an aromatic aldehyde compound, an aralkyl compound, and a phenol compound by a known method), phenol-modified xylene formaldehyde resins (those obtained by reacting a xylene formaldehyde resin and a phenol compound in the presence of an acidic catalyst by a known method), and phenol-modified dicyclopentadiene resins by methods similar to the above, and prepolymers thereof but are not particularly limited. One of these cyanate compounds can be used alone, or two or more of these cyanate compounds can be used in appropriate combination.

The maleimide compound is not particularly limited as long as it is a compound having one or more maleimide groups in one molecule. Those generally known can be used. Specific examples of the maleimide compound include 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, and prepolymers of these maleimide compounds and prepolymers of maleimide compounds and amine compounds. One of these maleimide compounds can be used alone, or two or more of these maleimide compounds can be used in appropriate combination.

The phenolic resin is not particularly limited as long as it is a phenolic resin having two or more hydroxy groups in one molecule. Those generally known can be used. Specific examples of the phenolic resin include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, polymerizable unsaturated hydrocarbon group-containing phenolic resins, and hydroxyl group-containing silicone resins. One of these phenolic resins can be used alone, or two or more of these phenolic resins can be used in appropriate combination.

One or two or more selected from the group consisting of an oxetane resin, a benzoxazine compound, and a compound having a polymerizable unsaturated group may be further contained in the resin composition in this embodiment in a range in which the operation and effect of the present invention are not impaired.

The oxetane resin is not particularly limited, and those generally known can be used. Specific examples of the oxetane resin include oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (trade name manufactured by Toagosei Co., Ltd.), and OXT-121 (trade name manufactured by Toagosei Co., Ltd.). One of these oxetane resins can be used alone, or two or more of these oxetane resins can be used in appropriate combination.

The benzoxazine compound is not particularly limited as long as it is a compound having two or more dihydrobenzoxazine rings in one molecule. Those generally known can be used. Specific examples of the benzoxazine compound include bisphenol A-based benzoxazine BA-BXZ (trade name manufactured by Konishi Chemical Ind. Co., Ltd.), bisphenol F-based benzoxazine BF-BXZ (trade name manufactured by Konishi Chemical Ind. Co., Ltd.), bisphenol S-based benzoxazine BS-BXZ (trade name manufactured by Konishi Chemical Ind. Co., Ltd.), and phenolphthalein-based benzoxazine. One of these benzoxazine compounds can be used alone, or two or more of these benzoxazine compounds can be used in appropriate combination.

The compound having a polymerizable unsaturated group is not particularly limited, and those generally known can be used. Specific examples of the compound having a polymerizable unsaturated group include vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; benzocyclobutene resins, and (bis)maleimide resins. One of these compounds having a polymerizable unsaturated group can be used alone, or two or more of these compounds having a polymerizable unsaturated group can be used in appropriate combination.

Further, the resin composition in this embodiment can further contain various polymer compounds such as a thermosetting resin, a thermoplastic resin, and an oligomer thereof, and an elastomer, a flame-retardant compound, various additives, and the like other than those described above in a range in which the operation and effect of the present invention are not impaired. These are not particularly limited as long as they are those generally used. The flame-retardant compound is not particularly limited. Examples thereof include bromine compounds such as 4,4-dibromobiphenyl, phosphates, melamine phosphate, phosphorus-containing epoxy resins, nitrogen compounds such as melamine and benzoguanamine; oxazine ring-containing compounds, and silicone-based compounds. In addition, the various additives are not particularly limited. Examples thereof include ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. One of these can be used alone or two or more of these can be used in appropriate combination as desired.

The resin composition in this embodiment can further contain an organic solvent as needed. In this case, the resin composition in this embodiment can be used as a form (solution or varnish) in which at least some, preferably all, of the above-described various resin components are dissolved in or compatible with the organic solvent. The organic solvent is not particularly limited as long as it can dissolve or be compatible with at least some, preferably all, of the above-described various resin components. Known ones can be appropriately used, and the type of the organic solvent is also not particularly limited. Specific examples of the organic solvent include polar solvents such as ketones such as acetone, methyl ethyl ketone, and methyl isobutyl ketone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, methyl methoxypropionate, and methyl hydroxyisobutyrate; and amides such as dimethylacetamide and dimethylformamide, and nonpolar solvents such as aromatic hydrocarbons such as toluene and xylene. One of these can be used alone, or two or more of these can be used in appropriate combination.

The resin composition in this embodiment can be used as a material for an insulating layer of a printed wiring board and a semiconductor package material though not particularly limited. For example, a prepreg can be provided by impregnating or coating a base material with a solution of the resin composition in this embodiment dissolved in a solvent and drying the solution.

In addition, a buildup film or a dry film solder resist can be provided by using a peelable plastic film as a base material, coating the plastic film with a solution of the resin composition in this embodiment dissolved in a solvent, and drying the solution. Here, the solvent can be dried by heating at a temperature of 20° C. to 150° C. for 1 to 90 minutes. In addition, the resin composition can also be used in an uncured state in which the solvent is only dried, or in a semi-cured (B-staged) state as needed.

<Prepreg>

A prepreg in this embodiment will be described in detail below. The prepreg in this embodiment comprises a base material; and the resin composition in this embodiment described above with which the base material is impregnated or coated. The method for producing the prepreg is not particularly limited as long as it is a method of combining the resin composition in this embodiment and a base material to produce a prepreg. The prepreg is obtained by impregnating or coating a base material with the resin composition in this embodiment described above. More specifically, the prepreg in this embodiment can be produced by impregnating or coating a base material with the resin composition in this embodiment and then semi-curing the resin composition by a method involving drying at 120 to 220° C. for about 2 to 15 minutes, or the like. At this time, the amount of the resin composition adhered to the base material, that is, the amount of the resin composition (including the filler (C)) based on the total amount (100% by mass) of the prepreg after the semi-curing, is preferably in the range of 20 to 99% by mass.

The base material in this embodiment is not particularly limited, and, for example, known base materials used for various printed wiring board materials can be used. Specific examples of the base material include woven fabrics of fibers of glass such as E glass, D glass, L glass, S glass, T glass, Q glass, UN glass, NE glass, and spherical glass; inorganic fibers of materials other than glass, such as quartz; organic fibers of polyimides, polyamides, polyesters, and the like; liquid crystal polyesters; and the like. The shape of the base material is not particularly limited. Examples thereof include woven fabrics, nonwoven fabrics, rovings, chopped strand mats, and surfacing mats. The shape of the base material may be any. One base material can be used alone, or two or more base material can be used in appropriate combination. In addition, although not particularly limited, in laminate applications, the thickness of the base material is preferably in the range of 0.01 to 0.2 mm, and it is preferred from the viewpoint of dimensional stability that the base material is particularly a woven fabric subjected to ultra-opening treatment or clogging treatment. Further, glass woven fabrics surface-treated with silane coupling agents for epoxysilane treatment, aminosilane treatment, and the like are preferred from the viewpoint of moisture absorption heat resistance. In addition, liquid crystal polyester woven fabrics are preferred in terms of electrical characteristics.

<Metal Foil-Clad Laminate>

A metal foil-clad laminate in this embodiment comprises one of the prepreg in this embodiment described above or two or more of the prepregs in this embodiment described above laminated; and metal foil laminate-molded on one surface or both surfaces of the prepreg. Specifically, the metal foil-clad laminate can be fabricated by using one of the above-described prepreg or stacking a plurality of the above-described prepregs, disposing foil of a metal such as copper or aluminum on one surface or both surfaces of the prepreg or the stack, and laminate-molding the metal foil and the prepreg or the stack. The metal foil in this embodiment is not particularly limited as long as it is a metal foil that can be used for a printed wiring board material. Copper foil such as rolled copper foil and electrolytic copper foil is preferred. In addition, the thickness of the metal foil is not particularly limited but is preferably 2 to 70 μm, more preferably 3 to 35 μm. As the molding conditions, usual methods for laminates and multilayer boards for printed wiring boards can be applied. For example, the metal foil-clad laminate in this embodiment can be produced by laminate-molding with a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition, a multilayer board can also be provided by laminate-molding the above prepreg and a separately fabricated wiring board for an inner layer in combination. As the method for producing a multilayer board, for example, a multilayer board can be fabricated by disposing 35 μm copper foil on both surfaces of one of the above-described prepreg, laminating and forming the copper foil and the prepreg under the above conditions, then forming inner layer circuits, subjecting these circuits to blackening treatment to form an inner layer circuit board, then alternately disposing these inner layer circuit boards and the above prepregs one by one, further disposing copper foil on the outermost layers, and laminate-molding the copper foil, the inner layer circuit boards, and the prepregs under the above conditions preferably under vacuum.

The metal foil-clad laminate in this embodiment can be preferably used as a printed wiring board. The printed wiring board can be produced according to an ordinary method, and the method for producing the printed wiring board is not particularly limited. One example of a method for producing a printed wiring board will be shown below. First, a metal foil-clad laminate such as the above-described copper-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed. Then, the required number of the above-described prepregs are stacked on the inner layer circuit surfaces, metal foil for outer layer circuits is further laminated on the outside of the stack, and heat and pressure are applied for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed wiring board is produced.

<Printed Wiring Board>

A printed wiring board in this embodiment comprises an insulating layer comprising the resin composition in this embodiment described above; and a conductor layer formed on one surface or both surfaces of the insulating layer. The insulating layer has a configuration in which it comprises the resin composition in this embodiment described above. In other words, the prepreg in this embodiment described above (the base material and the resin composition in this embodiment with which the base material is impregnated or coated) and the resin composition layer of the metal foil-clad laminate in this embodiment described above (the layer comprising the resin composition in this embodiment) are composed of an insulating layer comprising the resin composition in this embodiment.

A resin sheet in this embodiment comprises a sheet base material; and the resin composition in this embodiment described above applied and dried on one surface or both surfaces of the sheet base material. The resin sheet can be obtained by coating a sheet base material with a solution of the resin composition dissolved in a solvent (resin composition) (applying a solution of the resin composition dissolved in a solvent (resin composition)) to a sheet base material) and drying the solution. The sheet base material in this embodiment is not particularly limited. Examples thereof include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped base materials such as glass plates, SUS plates, and FRP. The coating method is not particularly limited. Examples thereof include a method of coating a sheet base material with a solution of the resin composition in this embodiment dissolved in a solvent by a bar coater, a die coater, a doctor blade, a baker applicator, or the like. In addition, a single-layer sheet (resin sheet) can also be provided by drying the solution after coating, and peeling or etching the resin sheet from the laminated sheet. A single-layer sheet (resin sheet) can also be obtained without using a sheet base material by supplying a solution of the above resin composition in this embodiment dissolved in a solvent into a mold having a sheet-shaped cavity, and drying the solution, or the like for molding into a sheet shape.

In fabrication of the single-layer sheet or the laminated resin sheet in this embodiment, the drying conditions when the solvent is removed are not particularly limited but are preferably a temperature of 20° C. to 200° C. for 1 to 90 minutes because at low temperature, the solvent is likely to remain in the resin composition, and at high temperature, curing of the resin composition proceeds. In addition, the thickness of the single-layer sheet or the resin layer of the resin sheet in this embodiment can be adjusted by the concentration and coating thickness of the solution of the resin composition in this embodiment and is not particularly limited but is preferably 0.1 to 500 μm because generally, when the coating thickness increases, the solvent is likely to remain during drying.

EXAMPLES

This embodiment will be described in more detail below by showing Synthesis Examples, an Example, and Comparative Examples, but this embodiment is not limited by these in any way.

Synthesis Example 1

Synthesis of Cyanate Compound of Furan Ring-Containing Phenol Novolac Resin (Hereinafter Abbreviated as "FPRCN")

FPRCN represented by the following formula (1) was synthesized as described later.

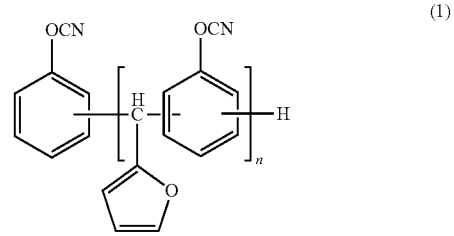

(1)

wherein n represents an integer of 1 to 20.

Synthesis of Furan Ring-Containing Phenol Novolac Resin (Hereinafter Abbreviated as "FPROH")

First, FPROH represented by the following formula (2) was synthesized.

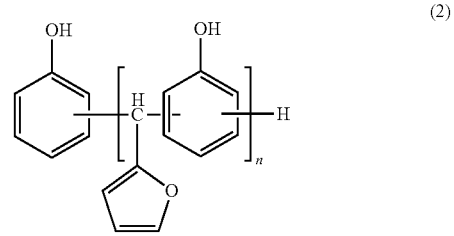

(2)

wherein n represents an integer of 1 to 20.

Specifically, 113 g of phenol, 28 g of methanol, and 12 g of sodium hydroxide were charged, and after stirring and dissolution, the solution was heated to reflux, and 29 g of furfural was dropped thereinto over 2 hours. Then, the mixture was reacted at reflux temperature (90 to 100° C.) for 20 hours and then neutralized with 30 g of a 35% hydrochloric acid aqueous solution, and 5 g of a 80% hydrazine aqueous solution was added. Then, 150 g of methyl isobutyl ketone was added, and water washing was repeated. Then, the unreacted phenol and the methyl isobutyl ketone were distilled off under heating and reduced pressure to obtain 332 g of FPROH. The OH group equivalent of the obtained FPROH was 139 g/eq.

Synthesis of FPRCN

Next, 20 g of the FPROH obtained by the above method (OH group equivalent 139 g/eq.) (0.14 mol in terms of OH groups) (weight average molecular weight Mw 500) and 7.3 g (0.07 mol) (0.5 mol based on 1 mol of hydroxy groups) of triethylamine were dissolved in 182 g of dichloromethane, and this solution was a solution 1.

While 13.3 g (0.22 mol) (1.5 mol based on 1 mol of hydroxy groups) of cyanogen chloride, 31.0 g of dichloromethane, 32.8 g (0.32 mol) (2.25 mol based on 1 mol of hydroxy groups) of 36% hydrochloric acid, and 163.9 g of water were kept at a liquid temperature of −2 to −0.5° C. under stirring, the solution 1 was poured over 30 minutes. After completion of pouring of the solution 1, the mixture was stirred at the same temperature for 30 minutes, and then a solution of 14.6 g (0.14 mol) (1.0 mol based on 1 mol of hydroxy groups) of triethylamine dissolved in 14.6 g of dichloromethane (solution 2) was poured over 30 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed with 100 mL of 0.1 N hydrochloric acid and then washed seven times with 100 g of water. The electrical conductivity of the wastewater from the seventh water washing was 20 µS/cm, and it was confirmed that removable ionic compounds were sufficiently removed by the washing with water.

The organic phase after the water washing was concentrated under reduced pressure and finally concentrated to dryness at 90° C. for 1 hour to obtain 21.2 g of the target cyanate compound FPRCN (black-purple viscous material). The weight average molecular weight Mw of the obtained cyanate compound FPRCN was 930. In addition, the IR spectrum of FPRCN showed absorption at 2236 cm$^{-1}$ and 2264 cm$^{-1}$ (cyanate groups) and showed no absorption of hydroxy groups. It was possible to dissolve 50% by mass or more of FPRCN in methyl ethyl ethyl ketone at 25° C.

Synthesis Example 2

Synthesis of Naphthol Aralkyl-Based Cyanate (Hereinafter Abbreviated as "SNCN")

300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane, and this solution was a solution 1.

While 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 µS/cm, and it was confirmed that removable ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The weight average molecular weight Mw of the obtained SNCN was 600. In addition, the IR spectrum of SNCN showed absorption at 2250 cm$^{-1}$ (cyanate groups) and showed no absorption of hydroxy groups.

Example 1

50 parts by mass of the FPRCN obtained by Synthesis Example 1, 50 parts by mass of a biphenyl aralkyl-based epoxy resin (NC-3000-FH, manufactured by Nippon Kayaku Co., Ltd.), and 100 parts by mass of fused silica (SC2050 MB, manufactured by Admatechs Company Limited) were mixed to obtain a varnish. This varnish was diluted with methyl ethyl ketone, and an E-glass woven fabric having a thickness of 0.1 mm was impregnated and coated with the diluted varnish and heated and dried at 150° C. for 5 minutes to obtain a prepreg having a resin content of 50% by mass.

Eight of the obtained prepregs were stacked, and 12 µm thick electrolytic copper foil (3EC-M3-VLP, manufactured by MITSUI MINING & SMELTING CO., LTD.) was disposed on the top and the bottom. The stack was laminate-molded at a pressure of 30 kgf/cm$^2$ and a temperature of 220° C. for 120 minutes to obtain a metal foil-clad laminate having an insulating layer thickness of 0.8 mm. Evaluation of glass transition temperature, copper foil peel strength, plating peel strength, and moisture absorption heat resistance was performed using the obtained metal foil-clad laminate. The results are shown in Table 1.

(Measurement Methods and Evaluation Methods)
1) Glass transition temperature (Tg): The metal foil-clad laminate obtained in Example 1 was cut to a size of 40 mm×20 mm, and the glass transition temperature was measured by a dynamic viscoelasticity analyzer (manufactured by TA Instruments) by a DMA method in accordance with JIS C6481.
2) Moisture absorption heat resistance: The metal foil-clad laminate obtained in Example 1 was cut to a size of 50 mm×50 mm, and all the copper foil of the cut metal foil-clad laminate except half of the copper foil on one surface was removed by etching to obtain a test piece. The test piece was treated at 121° C. and 2 atmospheres by a pressure cooker tester (manufactured by HIRAYAMA MANUFACTURING CORPORATION, model PC-3) for 5 hours and then immersed in solder at 260° C. for 60 seconds. Then, appearance change was visually observed, and the moisture absorption heat resistance was evaluated according to the following evaluation criterion:

the evaluation criterion=the number of occurrences of blistering/the number of tests 3) Copper foil peel strength: The metal foil-clad laminate obtained in Example 1 was cut to a size of 30 mm×150 mm. The copper foil peel strength was measured with a number of tests of 3 in accordance with JIS C6481, and the average value of the lower limit values was the measured value.
4) Plating peel strength: The electrolytic copper foil of the metal foil-clad laminate obtained in Example 1 was removed by etching, and the laminate was immersed in a swelling treatment liquid (400 ml/L of OPC-B103 Pre Etch, 13 g/L of sodium hydroxide) manufactured by Okuno Chemical Industries Co., Ltd. at 65° C. for 5 minutes. Next, the laminate was immersed in a roughening treatment liquid (100 ml/L of OPC-1540MN, 100 ml/L of OPC-1200 Epo Etch) manufactured by Okuno Chemical Industries Co., Ltd. at 80° C. for 8 minutes. Finally, the laminate was immersed to desmear treatment in a neutralization treatment liquid (200 ml/L of OPC-1300 Neutralizer) manufactured by Okuno Chemical Industries Co., Ltd. at 45° C. for 5 minutes. Then, electroless copper plating of about 0.5 μm was provided by the process of electroless copper plating manufactured by Okuno Chemical Industries Co., Ltd. (names of chemical solutions used: OPC-370 Condiclean M, OPC-SAL M, OPC-80 Catalyst, OPC-555 Accelerator M, ATS Add-copper IW), and drying was performed at 130° C. for 1 hour. Next, electrolytic copper plating was provided so that the thickness of plating copper was 18 μm (30 mm×150 mm×0.8 mm), and drying was performed at 180° C. for 1 hour. In this manner, a circuit wiring board sample in which a conductor layer (plating copper) having a thickness of 18 μm was formed on an insulating layer was fabricated. For the adhesive force of the plating copper, using the circuit wiring board sample, the peel strength was measured with a number of tests of 3 in accordance with JIS C6481, and the average value of the lower limit values was the measured value.

Comparative Example 1

A metal foil-clad laminate having a thickness of 0.8 mm was obtained as in Example 1 except that 50 parts by mass of a bisphenol A-based cyanate compound (CA210, manufactured by MITSUBISHI GAS CHEMICAL COMPANY, INC.) was used instead of using 50 parts by mass of FPRCN in Example 1. The glass transition temperature (Tg), moisture absorption heat resistance, and peel strength of the obtained metal foil-clad laminate were evaluated as in Example 1. The evaluation results are shown in Table 1.

Comparative Example 2

A metal foil-clad laminate having a thickness of 0.8 mm was obtained as in Example 1 except that 50 parts by mass of the SNCN obtained by Synthesis Example 2 was used instead of using 50 parts by mass of FPRCN in Example 1. The glass transition temperature (Tg), moisture absorption heat resistance, and peel strength of the obtained metal foil-clad laminate were evaluated as in Example 1. The evaluation results are shown in Table 1.

TABLE 1

|  | Example 1 | Comparative Example 1 | Comparative Example 2 |
|---|---|---|---|
| Glass transition temperature (° C.) | 275 | 262 | 253 |
| Moisture absorption heat resistance (after treatment for 5 hours) | 0/4 | 3/4 | 0/4 |
| Peel strength (kN/m) | 1.04 | 0.78 | 0.86 |
| Plating peel strength (kN/m) | 0.29 | 0.29 | 0.37 |

As is clear from Table 1, it was at least confirmed that by using the resin composition in the Example, a prepreg, a metal foil-clad laminate, and a printed wiring board that also had excellent peel strength in addition to excellent moisture absorption heat resistance and heat resistance were realized.

This application is based on Japanese Patent Application No. 2015-016460 filed with the Japan Patent Office on Jan. 30, 2015, the contents of which are incorporated herein by reference.

INDUSTRIAL APPLICABILITY

As described above, the resin composition for a printed wiring board according to the present invention can be widely and effectively used in various applications such as electrical and electronic materials, machine tool materials, and aviation materials, for example, as electrical insulating materials, semiconductor plastic packages, sealing materials, adhesives, lamination materials, resists, and buildup laminate materials, and, particularly, can be especially effectively used as printed wiring board materials adapted to higher integration and higher density for information terminal equipment, communication equipment, and the like in recent years. In addition, the prepreg, the metal foil-clad laminate, the resin sheet, and the printed wiring board according to the present invention have performance also excellent in peel strength in addition to moisture absorption heat resistance and heat resistance, and therefore their industrial practicality is extremely high.

The invention claimed is:
1. A resin composition for a printed wiring board comprising a cyanate compound (A) represented by following general formula (1):

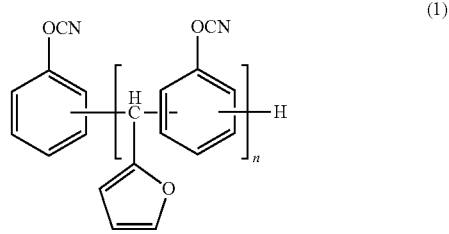

wherein n represents an integer of 1 or more; and
an epoxy resin (B).
2. The resin composition for the printed wiring board according to claim 1, wherein the cyanate compound (A) represented by the general formula (1) is obtained by cyanation of a furan ring-containing phenol novolac resin.

3. The resin composition for the printed wiring board according to claim 1, comprising 1 to 90% by mass of the cyanate compound (A) represented by the general formula (1) based on a total amount (100% by mass) of resin solids in the resin composition for the printed wiring board.

4. The resin composition for the printed wiring board according to claim 1, further comprising a filler (C).

5. The resin composition for the printed wiring board according to claim 4, comprising 50 to 1600 parts by mass of the filler (C) based on the total amount (100 parts by mass) of the resin solids in the resin composition for the printed wiring board.

6. The resin composition for the printed wiring board according to claim 1, further comprising one or two or more selected from the group consisting of a maleimide compound, a phenolic resin, and a cyanate compound other than the cyanate compound (A) represented by the general formula (1).

7. The resin composition for the printed wiring board according to claim 1, wherein the epoxy resin (B) is one or two or more selected from the group consisting of a biphenyl aralkyl-based epoxy resin, a naphthylene ether-based epoxy resin, a polyfunctional phenol-based epoxy resin, and a naphthalene-based epoxy resin.

8. A prepreg comprising a base material; and the resin composition for the printed wiring board according to claim 1 with which the base material is impregnated or coated.

9. A metal foil-clad laminate comprising one of the prepreg according to claim 8; and metal foil laminate-molded on at least one surface of the prepreg.

10. A metal foil-clad laminate comprising two or more of the prepregs according to claim 8 laminated; and metal foil laminate-molded on at least one surface of the prepreg.

11. A resin sheet comprising a sheet base material; and the resin composition for the printed wiring board according to claim 1 applied and dried on at least one surface of the sheet base material.

12. A printed wiring board comprising an insulating layer comprising the resin composition for the printed wiring board according to claim 1; and a conductor layer formed on at least one surface of the insulating layer.

* * * * *